(12) United States Patent
Ludviksson et al.

(10) Patent No.: US 7,553,427 B2
(45) Date of Patent: Jun. 30, 2009

(54) PLASMA ETCHING OF CU-CONTAINING LAYERS

(75) Inventors: Audunn Ludviksson, Scottsdale, AZ (US); Lee Chen, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/514,202

(22) PCT Filed: Apr. 14, 2003

(86) PCT No.: PCT/US03/10469

§ 371 (c)(1),
(2), (4) Date: Nov. 12, 2004

(87) PCT Pub. No.: WO03/098662

PCT Pub. Date: Nov. 27, 2003

(65) Prior Publication Data

US 2005/0167399 A1   Aug. 4, 2005

Related U.S. Application Data

(60) Provisional application No. 60/379,754, filed on May 14, 2002.

(51) Int. Cl.
*C23F 1/00* (2006.01)

(52) U.S. Cl. .......................................... 216/67; 216/78
(58) Field of Classification Search .................. None
See application file for complete search history.

(56) References Cited

U.S. PATENT DOCUMENTS

| | | | |
|---|---|---|---|
| 4,919,750 A | | 4/1990 | Bausmith et al. |
| 5,700,740 A | * | 12/1997 | Chen et al. .................. 438/710 |
| 5,783,459 A | * | 7/1998 | Suzuki et al. ............... 438/612 |
| 5,998,297 A | | 12/1999 | Brennan |
| 2002/0197761 A1 | * | 12/2002 | Patel et al. .................... 438/52 |

FOREIGN PATENT DOCUMENTS

JP          07-161687          6/1995

OTHER PUBLICATIONS

Written Opinion received in PCT/US03/10469 Nov. 12, 2004.

* cited by examiner

*Primary Examiner*—Allan Olsen
(74) *Attorney, Agent, or Firm*—Oblon, Spivak, McClelland, Maier & Neustadt, P.C.

(57) ABSTRACT

A method and apparatus are provided for plasma etching of Cu-containing layers in semiconductor devices using an aluminum source in the presence of a halogen-containing plasma. The aluminum source reacts with halogenated Cu-containing surfaces and forms volatile etch products that allows for anisotropic etching of Cu-containing layers using conventional plasma etching tools.

19 Claims, 6 Drawing Sheets

PLASMA ETCHING OF CU-CONTAINING LAYERS

CROSS-REFERENCE TO RELATED APPLICATIONS

The present application claims priority and is related to U.S. application Ser. No. 60/379,754, filed on May 14, 2002. The present application is also related to U.S. application Ser. No. 60/392,045, filed on Jun. 28, 2002. The entire contents of both of those applications are herein incorporated by reference.

FIELD OF THE INVENTION

The present invention relates to plasma etching of copper-containing layers used in semiconductor applications.

BACKGROUND OF THE INVENTION

Copper (Cu) is emerging as the metal of choice in a wide variety of semiconductor applications. Lower electrical resistivity, coupled with improved electromigration performance and increased stress migration resistance are important material properties that favor the use of Cu over aluminum (Al) in interconnect lines and contacts. The lower electrical resistance is critical since it allows signals to move faster by reducing the RC time delay. The superior resistance to electromigration, a common reliability problem in Al lines, means that Cu can handle higher power densities. An equally important benefit of Cu over Al is that the manufacturing cost for a Cu metallization scheme can be lower due to new processing methods that reduce the number of manufacturing steps and alleviate the need for some of the most difficult steps.

However, the introduction of Cu into multilevel metallization architecture requires new processing methods for Cu patterning. Because Cu is difficult to dry etch, new process schemes have been developed for Cu patterning. The damascene approach is based on etching features in the dielectric material, filling them with Cu metal, and planarizing the top surface by chemical mechanical polishing (CMP). Dual damascene schemes integrate both the contacts and the interconnect lines into a single processing scheme. However, Cu CMP technology is challenging and it has difficulty defining extremely fine features.

An alternative to the damascene approach is a patterned etching of a Cu layer. The patterned etch process involves deposition of a Cu layer on a substrate; the use of a patterned hard mask or photoresist over the Cu layer; patterned etching of the Cu layer using a reactive ion etching (RIE) process; and deposition of dielectric material over the patterned Cu layer. Patterned etching of Cu can have advantages over damascene processes since it is easier to etch fine Cu patterns and then deposit a dielectric layer onto the Cu pattern, than it is to get barrier layer materials and Cu metal to adequately fill small feature openings in a dielectric film.

Magnetoresistive random access memory (MRAM), is an example of new memory technology that can benefit from new dry etching methods for patterning Cu layers with magnetic materials. The lack of suitable fast etching processes for materials such as Cu and various magnetic materials, can limit the ability to batch-fabricate sub-micron magnetic devices. Magnetic materials, that contain transition metals such as Ni, Fe and Co, are substantially inert in conventional dry etch processes. Patterning of magnetic devices has been predominantly accomplished using $Ar^+$-ion milling or additive deposition processes such as electroplating or lift-off, but these methods are undesirable for semiconductor batch processing.

The primary etch gas for etching Al and Cu layers is traditionally a chlorine-containing gas in a gas mixture that includes argon (Ar). The chlorine-containing gas is selected from a large group of chlorine compounds such as $Cl_2$, HCl, $BCl_3$, $SiCl_4$, $CHCl_3$, $CCl_4$, and combinations thereof. To achieve anisotropic etching, $Cl_2$ is mixed with other chlorine-containing gases that are selected from the above list, since the use of $Cl_2$ alone results in isotropic etching.

Etching of Cu layers using chlorine plasma essentially involves physical sputtering of the $CuCl_x$ layer by energetic ions in the plasma. The etching rates with this method are very low and another drawback is that the sputtered $CUCl_x$ coats the chamber walls and this requires periodic cleaning of the chamber. An equally serious problem is encountered when high-aspect-ratio features are etched in chlorine plasma and the sputtered $CuCl_x$ products redeposit on the feature sidewalls where the effects of physical sputtering are reduced.

Furthermore, when the process is carried out at elevated temperatures (>200° C.) to increase the volatility of the reacted Cu layer, corrosion can occur due to accumulated $CuCl_x$ etch residues on the surface. If these residues are not removed by a post-etch cleaning step, they can cause continuing corrosion of the Cu even after the application of a protective layer over the etched features.

Other approaches for dry etching of Cu that involve copper halides have been examined to try to accomplish higher Cu etch rates. In addition to high processing temperature, the use of additional energy sources, such as exposure of the etch surface to UV or IR light to accelerate the desorption of $CuCl_x$ have been proposed. These alternative approaches are not practical for semiconductor batch processing of large substrates due to poor etch uniformity, high cost and added equipment complexity, and reliability problems.

Nelson in U.S. Pat. No. 4,468,284 entitled "Process for etching an aluminum-copper alloy," describes a process for etching Al—Cu alloys that contain up to 6% Cu by weight. The plasma process comprises reactive chlorine and a $NO^+$ species that aids in the oxidation of Cu to $CuCl_2$. An $Al_2Cl_6$ reactant is formed in-situ from the etching of Al in the Al—Cu alloy and it reacts (complexes) with the surface $CuCl_2$ to form a volatile $CuCl_2$—$Al_2Cl_6$ complex that is removed from the etching surface.

Bausmith et al. in U.S. Pat. No. 4,919,750 entitled "Etching metal films with complexing plasma," describes a method for dry etching metals that form low-volatility chlorides. The method involves exposing a layer of metal to a chlorine-based plasma in presence of a metal source spaced apart from the workpiece. When reacted with the plasma, the metal source provides gaseous metal-containing reactants that serve as complexing agents with the metals in the surface of the workpiece to be etched. The workpiece can comprise Co, Cu or Ni metal films and the metal source is selected from Al, Ga, Fe and In.

Both of the abovementioned patents involve forming etching reactants in-situ during the process, which can result in poor control over the delivery of the etching reactant to the surface of the metal film to be etched. Therefore, to provide better etch control and better control over reactant delivery; it is desirable to introduce gaseous etching reactants from ex-situ sources such as gas cylinders or precursor containers.

Due to the introduction of Cu in new and existing thin-film technologies, there is a need for dry etching methods that allow etching and patterning of pure Cu layers and Cu-containing layers, using gaseous reactants that form volatile Cu-containing etch products.

SUMMARY OF THE INVENTION

It is a primary object of the present invention to provide a plasma processing system and method for etching pure Cu films and Cu-containing films for manufacturing devices on a substrate (e.g., a liquid crystal display on a liquid crystal display panel or an integrated circuit on a semiconductor wafer). The process environment comprises process gases that are capable of anisotropic etching of high-aspect-ratio features in accordance with a mask pattern.

The above and other objects are achieved, according to the present invention, by providing an apparatus and a method that uses a gaseous plasma environment comprising a reactive halogen species and an aluminum source. Reactive halogen species from the plasma oxidize the surface of the Cu-containing layer to be etched, forming low-volatility Cu-halide products that further react with the aluminum source to form Cu-containing etch products that are volatile at low substrate temperatures and are removed from the substrate with the aid of ion-assisted etching.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENT

In general, the present invention pertains to a plasma processing method for etching pure Cu layers, Al—Cu alloys, and other Cu-based alloys for manufacturing an integrated circuit.

The method uses a plasma process that comprises a reactive halogen species and an aluminum source to etch Cu-containing layers by forming volatile reaction products that are removed by ion-assisted etching.

For example, the reactive halogen species can be formed from a chlorine-containing gas that is selected from the group containing $Cl_2$, HCl, $BCl_3$, $SiCl_4$, $CHCl_3$, $CCl_4$, and mixtures thereof. Reactive halogen species can also be formed from non-chlorine containing gases such as aluminum bromide.

Al layers used in integrated circuits commonly contain a small amount of Cu (<5 at. %) to improve the materials properties of the Al layers. It has been observed that the addition of Cu to Al layers affects the etch rate of the layers, and this effect has been attributed to the formation of volatile etch products such as $CuCl_2$—$Al_2Cl_6$. A reduced etch rate for Al—Cu layer with high Cu content is possibly due to a limited supply of aluminum chloride from the etching of Al in the Al—Cu film, that is available for reacting (complexing) with the $CuCl_x$ etch products that have low volatility and, in the absence of a second etching agent, accumulate on the surface and prevent further etching.

According to the present invention, the aluminum species reacts (complexes) with the halogenated Cu layer and forms etch products that contain Al, Cu, and a halogen. In the case of chlorine, Cl-containing etch products are formed, possibly $CuCl_2$—$Al_2Cl_6$ and $CuCl_2$—$AlCl_3$ complexes, that are volatile enough to allow ion-assisted etching at relatively low substrate temperatures. The invention further allows for patterning of high-aspect-ratio Cu-containing structures according to a hard mask or a photoresist pattern using conventional plasma tools.

In an alternate embodiment, an inert gas is added to any one of the aforementioned process gas chemistries. The inert gas may include at least one of argon, helium, xenon, krypton, and nitrogen. For example, the addition of inert gas to the process chemistry is used to dilute the process gas or adjust the process gas partial pressure(s). Furthermore, for example, the addition of inert gas can aid the physical component of the feature etch.

Figure 1:
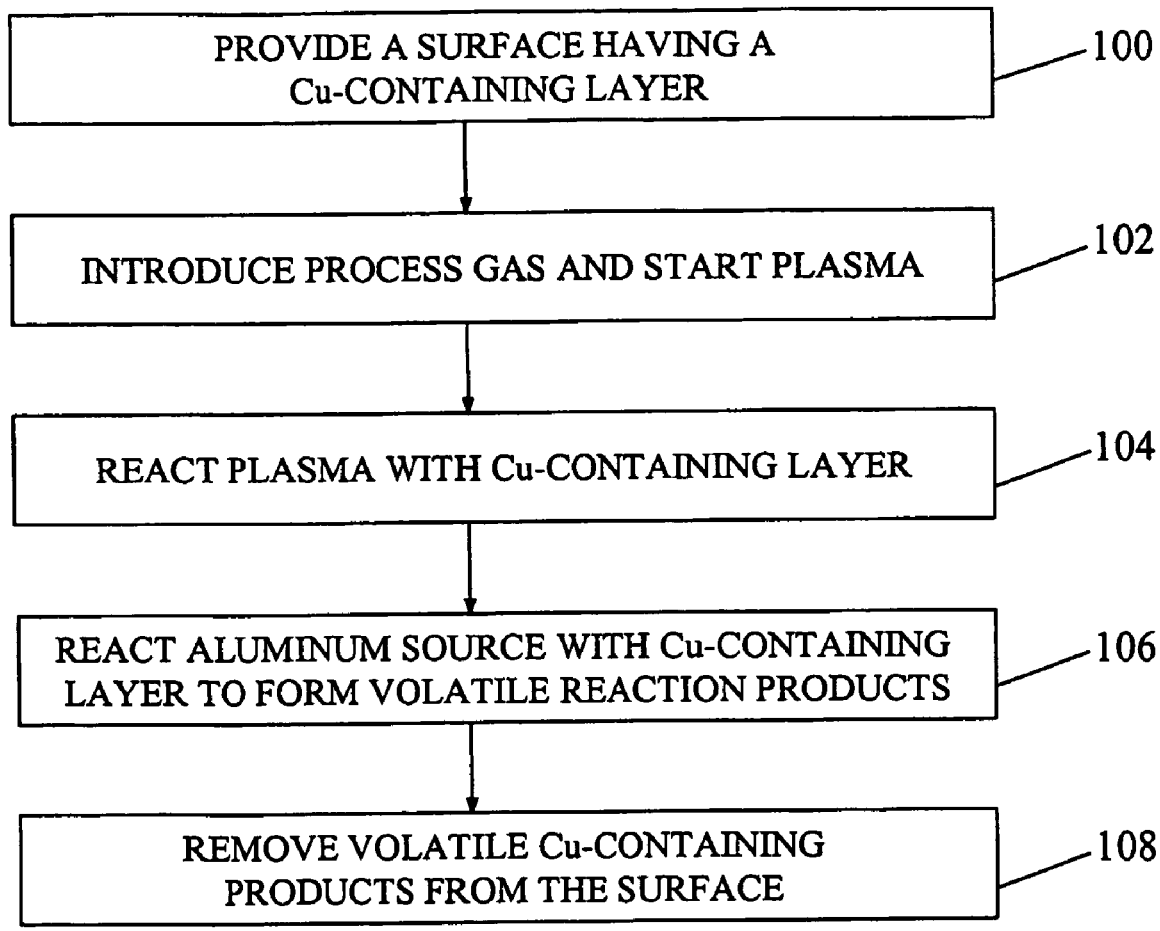
FIG. 1 is a flowchart for etching a Cu layer according the present invention.

FIG. 1 is a flowchart for etching a Cu-containing layer according the present invention. Step 100 provides a surface having a Cu-containing layer to a plasma process chamber. In step 102, a process gas comprising a halogen-containing reactant is introduced to the process chamber, and plasma is formed. The plasma species react with the Cu-containing layer in step 104. During the plasma etching process, a corrosive halide species is generated in the plasma and the surface is under constant ion bombardment in addition to exposure to an aluminum species. In step 106, an aluminum source reacts with the halogenated layer to form volatile reaction products that comprise Cu, Al, and a halogen. The volatile reaction products formed in step 106 are removed from the surface in step 108 with aid of ion-assisted desorption. The Cu-containing layer is exposed to the plasma for a time period that enables the desired etching of the Cu-containing layer.

Various aluminum sources can be used in the present invention to etch Cu-containing layers. For example, an aluminum halide compound such as aluminum chloride is a stable gas that is commercially available and has a relatively high vapor pressure (~10 Torr at 124° C.) that allows for efficient delivery of the aluminum chloride gas to the etching chamber. Amine alanes are well known aluminum compounds that are used in low temperature chemical vapor deposition (CVD) of aluminum. These compounds have the general formula $H_3AlNR_3$, where R is an alkyl group. The weak Al—N bond and thermal stability of the amine group ($NR_3$) allows Al deposition at temperatures as low as about 60° C. with very low carbon or oxygen contamination. Examples of amine alanes include trimethylamine alane (TMM) and dimethylethylamine alane (DMEAA). Other aluminum sources include trialkyl aluminum compounds such as trimethylaluminum (TMA), dialkyl aluminum hydrides such as dimethyl aluminum hydride (DMAH), and sputtered aluminum.

The handling and use of the abovementioned reagents are well known in the semiconductor industry. Liquid reagents can be introduced into the processing chamber using a delivery system that can comprise a bubbler system and a mass flow controller (MFC). A bubbler system can be used with or without a carrier gas such as argon (Ar). When a carrier gas is used, it is bubbled through the liquid and becomes saturated with reagent vapor. The partial pressure of the vapor in the process chamber is controlled by the temperature of the liquid in the bubbler. Alternatively, a liquid injection system can be used to deliver the reagents to the processing chamber. In the case of solid reagents, a carrier gas can be passed over the solid and the gas mixture introduced into the process chamber.

The gas flow rates of the etching gases can be independently controlled during processing. Exemplary flow rates are from 0 to 1000 sccm, with typical values being less than 500 sccm and preferably between 1 and 500 sccm. It should be noted that an aluminum halide gas may react with a copper containing layer when the gas is in either a plasma form or in a gaseous (non-plasma) form.

Figure 2:
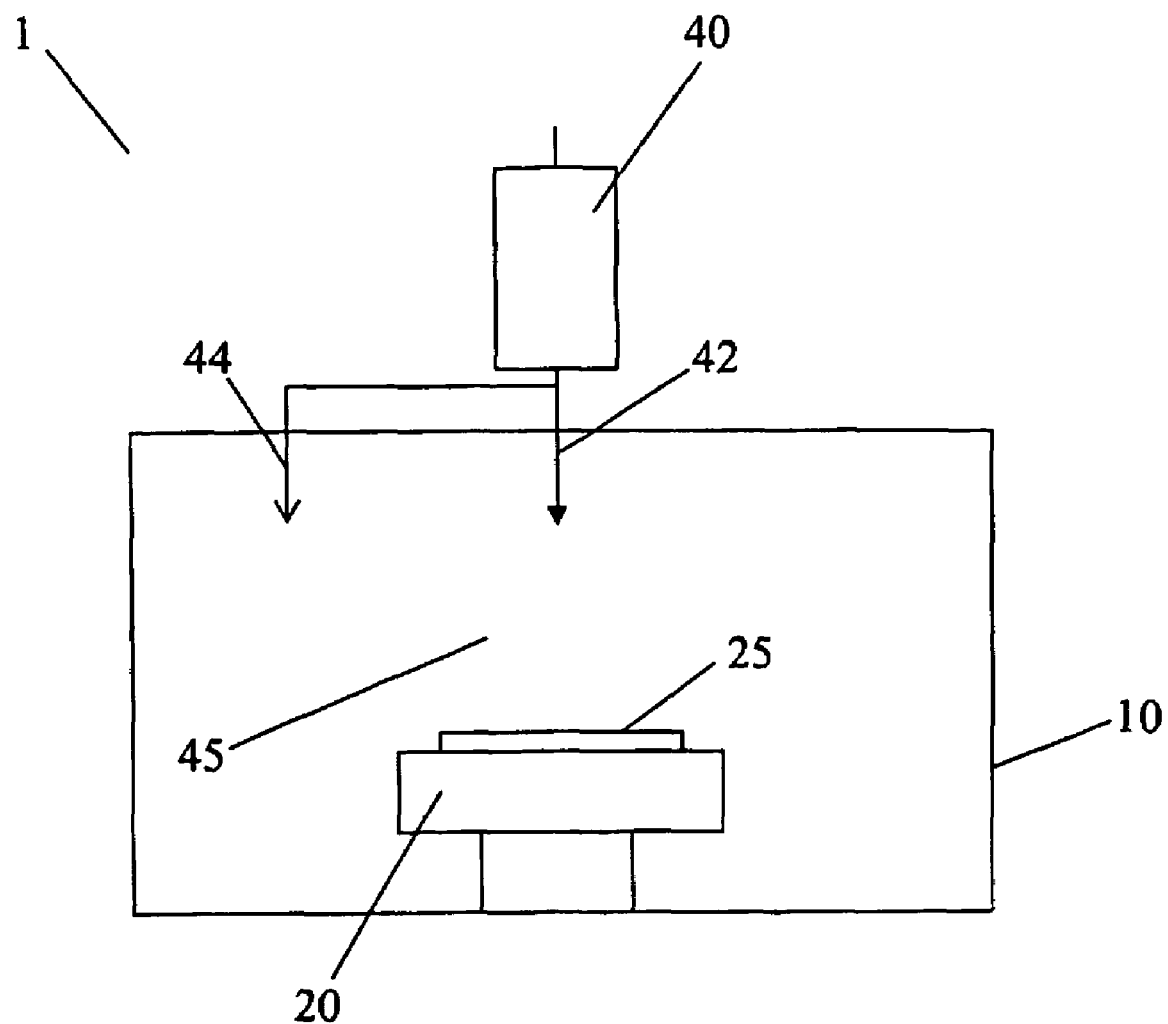
FIG. 2 shows a plasma processing system according to a preferred embodiment of the present invention.

FIG. 2 shows a plasma processing system according to a preferred embodiment of the present invention. In FIGS. 2-6, like reference numbers are used to indicate like elements throughout. A plasma processing system 1 that is capable of sustaining a plasma is depicted in FIG. 2, which includes a plasma process chamber 10 configured to facilitate the generation of plasma in processing region 45, wherein plasma is formed via collisions between heated electrons and an ionizable gas. The plasma processing system 1 further comprises a substrate holder 20, upon which a substrate 25 to be processed is affixed, and a gas injection system 40 for introducing process gases 42 to the plasma process chamber 10. Alternately, gas injection system 40 can comprise an auxiliary gas dispenser 44 for introducing process gases. The gas injection system 40 allows independent control over the delivery of process gases to the process chamber from ex-situ gas sources. The process gases can comprise an aluminum source, halogen-containing gases, and inert gases.

Process conditions that enable the desired etching of the Cu-containing layer in the current invention may be determined by direct experimentation and/or design of experiments (DOE). For example, adjustable process parameters can comprise plasma power, plasma frequencies, substrate temperature, process pressure, choice of process gases and relative gas flows of the process gases. Plasma power and plasma frequencies are process parameters that can be used to control the extent of dissociation of the etching reagents in the plasma, which in turn affect the efficiency of the etching process. In addition to the abovementioned process parameters, different methods for introducing process gases, such as the use of auxiliary gas dispenser 44, allow for additional control over the extent of dissociation of the etching reagents.

Figure 3:
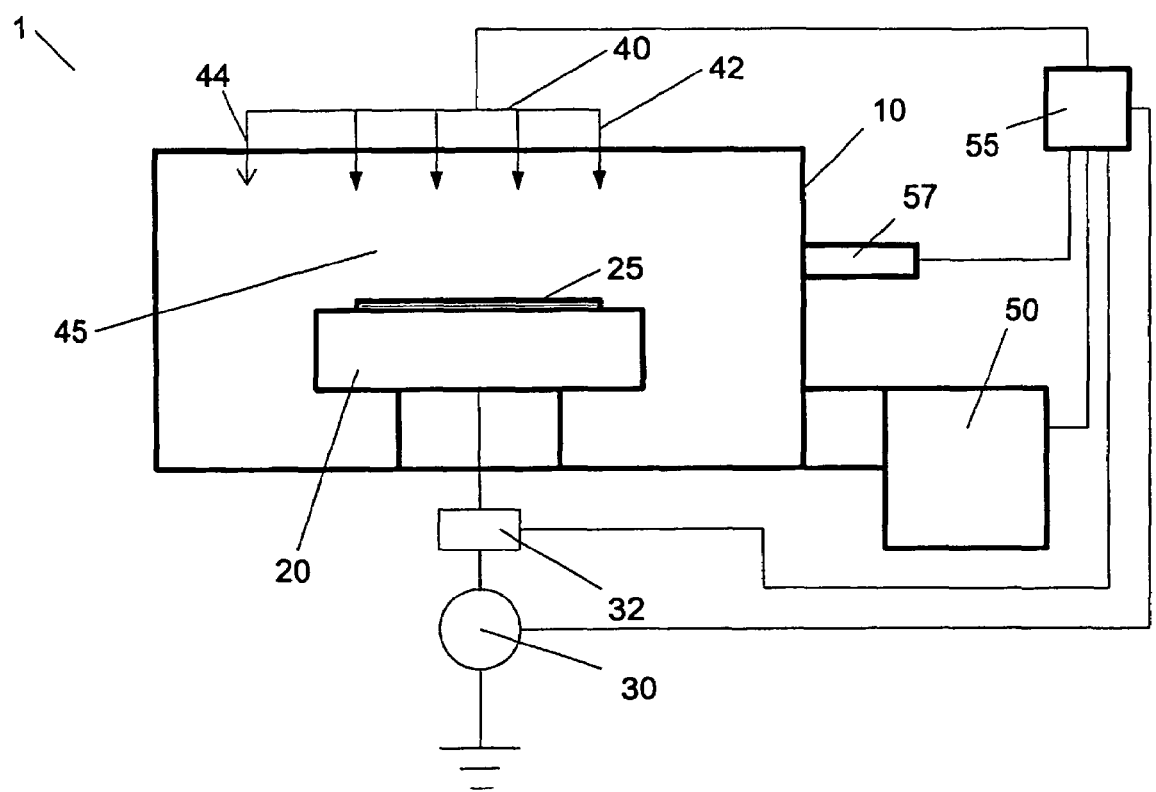
FIG. 3 shows a plasma processing system according to an alternate embodiment of the present invention.

FIG. 3 shows a plasma processing system according to an alternate embodiment of the present invention. A plasma processing device 1 is depicted which includes a chamber 10, a substrate holder 20, upon which a substrate 25 to be processed is affixed, a gas injection system 40, and a vacuum pumping system 50. Chamber 10 is configured to facilitate the generation of plasma in a processing region 45 adjacent a surface of substrate 25, wherein plasma is formed via collisions between heated electrons and an ionizable gas. An ionizable gas or mixture of gases is introduced via the gas injection system 40 and the process pressure is adjusted. For example, a gate valve (not shown) is used to throttle the vacuum pumping system 50. Desirably, plasma is utilized to create materials specific to a pre-determined materials process, and to aid either the deposition of material to a substrate 25 or the removal of material from the exposed surfaces of the substrate 25.

Substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers are included.

In the embodiment, shown in FIG. 3, the substrate holder 20 further serves as an electrode through which radio frequency (RF) power is coupled to plasma in the processing region 45. For example, the substrate holder 20 is electrically biased at a RF voltage via the transmission of RF power from an RF generator 30 through an impedance match network 32 to the substrate holder 20. The RF bias serves to heat electrons and, thereby, form and maintain plasma. In this configuration, the system operates as a RIE reactor, wherein the chamber and upper gas injection electrode serve as ground surfaces. A typical frequency for the RF bias ranges from 1 MHz to 100 MHz and is preferably 13.56 MHz.

In an alternate embodiment, RF power is applied to the substrate holder electrode at multiple frequencies. Furthermore, the impedance match network 32 serves to maximize the transfer of RF power to plasma in processing chamber 10 by minimizing the reflected power. Match network topologies (e.g., L-type, $\pi$-type, T-type) and automatic control methods are known in the art.

With continuing reference to FIG. 3, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown). Alternately, gas injection system 40 can comprise an auxiliary gas dispenser 44 for introducing additional process gases.

Vacuum pump system 50 preferably includes a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the gas injection system 40, plasma monitor system 57, and the vacuum pump system 50. A program stored in the memory is utilized to control the aforementioned components of a plasma processing system 1 according to a stored process recipe. One example of controller 55 is a digital signal processor (DSP), model number TMS320, available from Texas Instruments, Dallas, Tex.

The plasma monitor system 57 can comprise, for example, an optical emission spectroscopy (OES) system to measure excited particles in the plasma environment and a plasma diagnostic system, such as a Langmuir probe, for measuring plasma density. The plasma monitor system 57 can be used with controller 55 to determine the status of the etching process and provide feedback to ensure process compliance.

Figure 4:
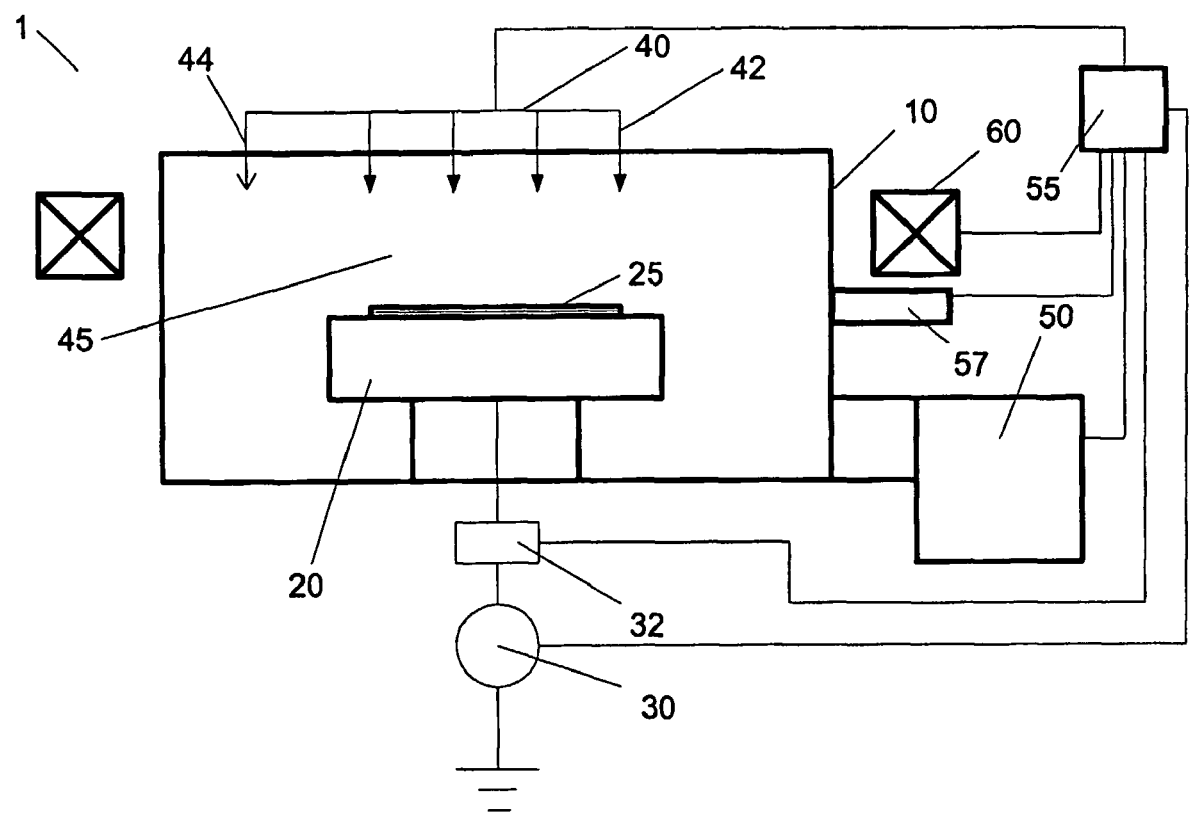
FIG. 4 shows a plasma processing system according to an alternate embodiment of the present invention.

FIG. 4 shows a plasma processing system according to an alternate embodiment of the present invention. The plasma processing system 1 of FIG. 3 further includes either a mechanically or electrically rotating DC magnetic field system 60, in order to potentially increase plasma density and/or improve plasma processing uniformity, in addition to those components described with reference to FIG. 3. Moreover, the controller 55 is coupled to the rotating magnetic field system 60 in order to regulate the speed of rotation and field strength.

Figure 5:
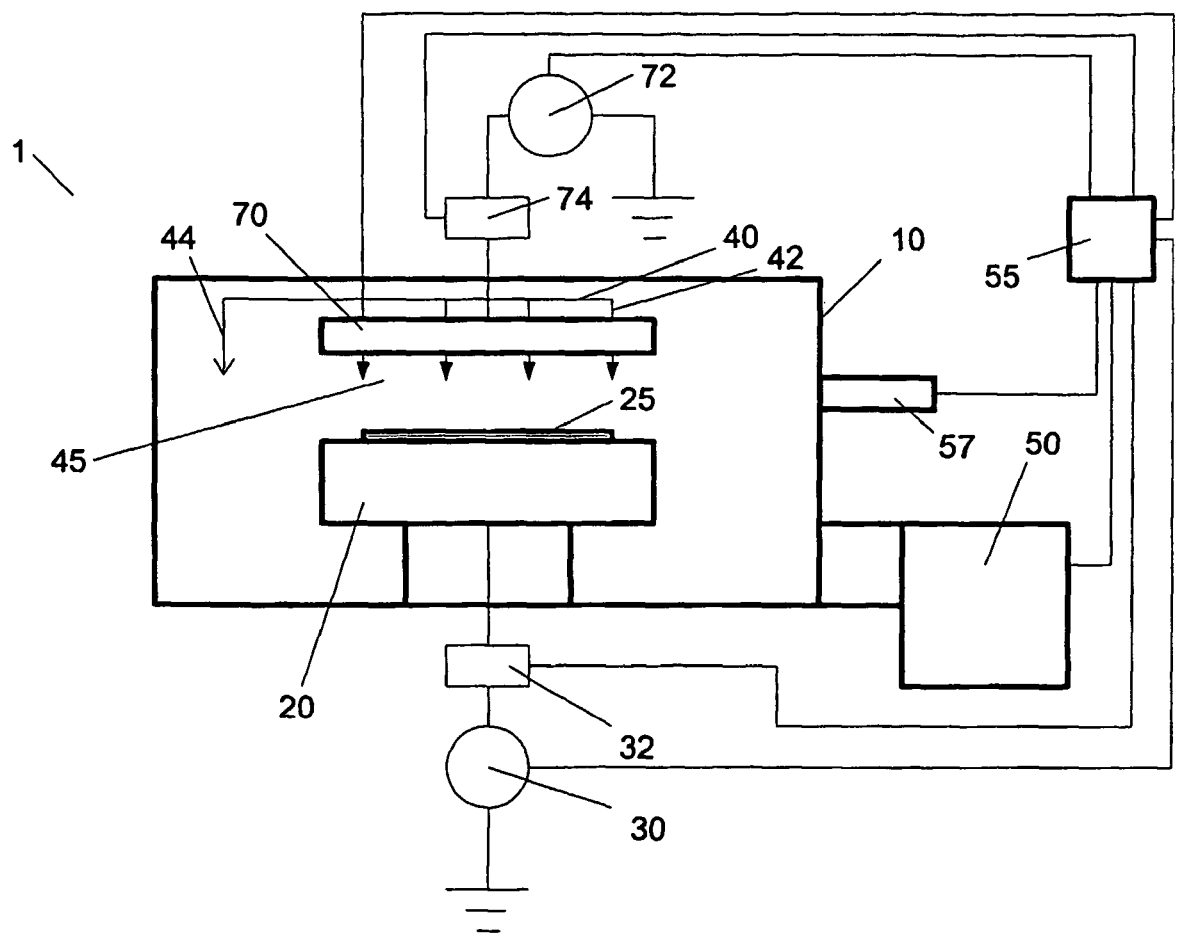
FIG. 5 shows a plasma processing system according to an alternate embodiment of the present invention.

FIG. 5 shows a plasma processing system according to an alternate embodiment of the present invention. The plasma processing system 1 of FIG. 3 further includes an upper plate electrode 70 to which RF power is coupled from an RF generator 72 through an impedance match network 74. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz and is preferably 2 MHz. Moreover, the controller 55 is coupled to the RF generator 72 and the impedance match network 74 in order to control the application of RF power to the upper electrode 70.

Figure 6:
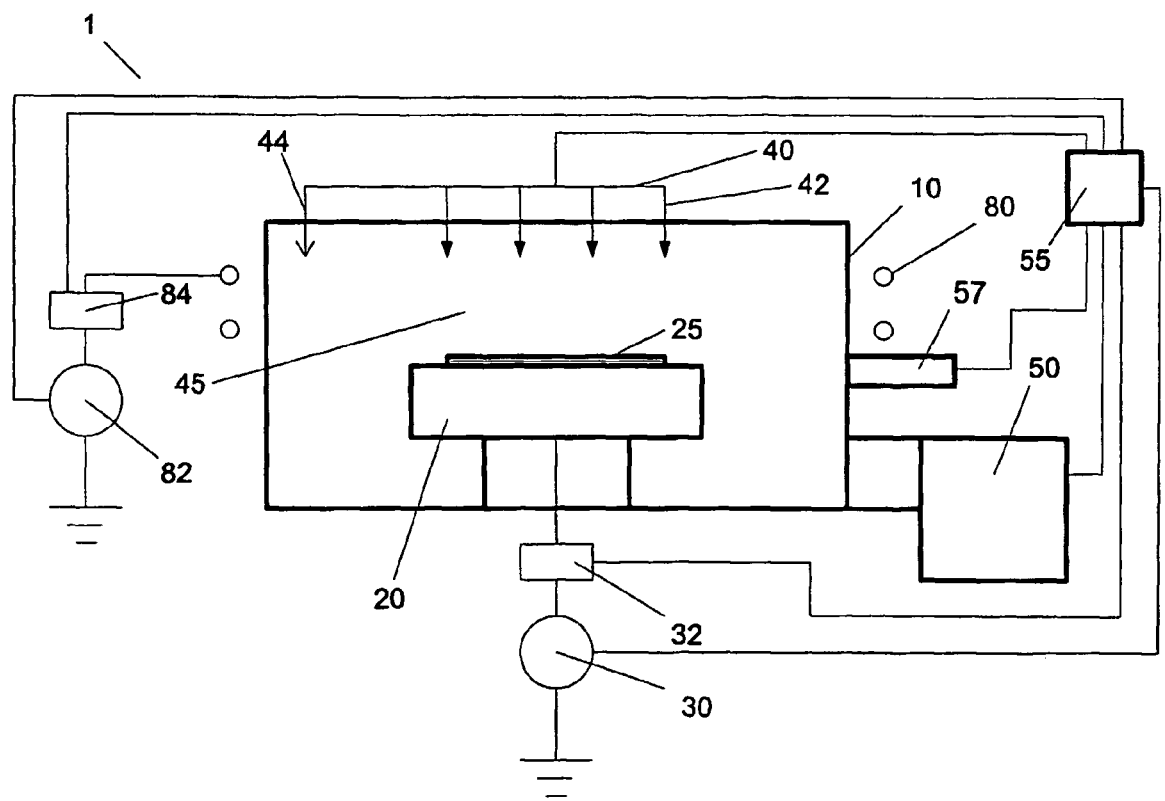
FIG. 6 shows a plasma processing system according to an alternate embodiment of the present invention.

FIG. 6 shows a plasma processing system according to an alternate embodiment of the present invention. The plasma processing system of FIG. 2 is modified to further include an inductive coil 80 to which RF power is coupled via an RF generator 82 through an impedance match network 84. RF power is inductively coupled from the inductive coil 80 through a dielectric window (not shown) to the plasma-processing region 45. A typical frequency for the application of RF power to the inductive coil 80 ranges from 10 MHz to 100 MHz and is preferably 13.56 MHz. Similarly, a typical frequency for the application of power to the chuck electrode ranges from 0.1 MHz to 30 MHz and is preferably 13.56 MHz. In addition, a slotted Faraday shield (not shown) is employed to reduce capacitive coupling between the inductive coil 80 and plasma. Moreover, the controller 55 is coupled to the RF generator 82 and the impedance match network 84 in order to control the application of power to the inductive coil 80.

In an alternate embodiment, the plasma is formed using electron cyclotron resonance (ECR). In yet another embodiment, the plasma is formed from the launching of a Helicon wave. In yet another embodiment, the plasma is formed from a propagating surface wave.

It should be understood that various modifications and variations of the present invention may be employed in practicing the invention. It is therefore to be understood that, within the scope of the appended claims, the invention may be practiced otherwise than as specifically described herein.

The invention claimed is:

1. A method of processing a copper-containing layer in a plasma etcher, the method comprising:
   providing a copper-containing layer overlying a substrate;
   introducing a process gas;
   forming a plasma from said process gas;
   introducing from a common source an aluminum-containing material into the plasma etcher from an ex situ commercially available gaseous source of aluminum by separate injection from the common source of the aluminum-containing material both into a plasma processing region proximate the substrate and into an exterior region removed from the substrate; and
   etching said copper-containing layer by exposing said copper-containing layer to said plasma and said aluminum-containing material, wherein said process gas reacts with said copper-containing layer.

2. The method according to claim 1, wherein said aluminum-containing material comprises an amine alane gas.

3. The method according to claim 1, wherein said aluminum-containing materials comprises a trialkyl aluminum gas.

4. The method according to claim 1, wherein said aluminum-containing materials comprises a dialkyl aluminum hydride gas.

5. The method according to claim 1 wherein said substrate is maintained at a temperature below 200° C.

6. The method according to claim 1 wherein said substrate is maintained at a temperature below 150° C.

7. The method according to claim 1 wherein said substrate is maintained at a temperature below 100° C.

8. The method according to claim 1, wherein said copper-containing layer comprises at least one of a pure Cu layer and an Al—Cu alloy.

9. The method according to claim 1, wherein said process gas comprises a chlorine-containing gas.

10. The method according to claim 9, wherein said chlorine-containing gas comprises at least one of $Cl_2$, HCl, $BCl_3$, $SiCl_4$, $CHCl_3$, $CCl_4$, and aluminum chloride.

11. The method according to claim 1, wherein said process gas further comprises an inert gas.

12. The method according to claim 11, wherein said inert gas comprises at, least one of argon, helium, krypton, xenon, and nitrogen.

13. The method according to claim 1, wherein said aluminum-containing material comprises an aluminum halide gas.

14. The method according to claim 13, further comprising introducing at least one of argon, helium, krypton, xenon, and nitrogen.

15. The method according to claim 13, wherein a flowrate of the aluminum halide is less than 1000 sccm.

16. The method according to claim 13, wherein the aluminum halide gas comprises an aluminum halide gas in plasma form.

17. The method according to claim 13, wherein said aluminum halide gas comprises an aluminum chloride gas.

18. The method according to claim 17, wherein a flowrate of the aluminum chloride is less than 1000 sccm.

19. The method according to claim 17, wherein the step of etching comprises etching said copper-containing layer using the aluminum chloride gas in gaseous form.

* * * * *